(12) United States Patent
Passaniti et al.

(10) Patent No.: US 11,669,168 B2
(45) Date of Patent: Jun. 6, 2023

(54) SYSTEM AND METHOD FOR TOUCH-GESTURE RECOGNITION

(71) Applicant: STMicroelectronics S.r.l., Agrate Brianza (IT)

(72) Inventors: Fabio Passaniti, Syracuse (IT); Enrico Rosario Alessi, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 313 days.

(21) Appl. No.: 17/157,584

(22) Filed: Jan. 25, 2021

(65) Prior Publication Data

US 2021/0232227 A1 Jul. 29, 2021

(30) Foreign Application Priority Data

Jan. 28, 2020 (IT) .................. 102020000001603

(51) Int. Cl.
*G06F 3/01* (2006.01)
*G06F 3/0346* (2013.01)
*G06F 3/041* (2006.01)
*G01R 29/12* (2006.01)
*G01R 29/24* (2006.01)
(Continued)

(52) U.S. Cl.
CPC ............ *G06F 3/017* (2013.01); *G06F 3/0346* (2013.01); *G06F 3/0412* (2013.01); *G06F 3/0416* (2013.01); *G01R 29/12* (2013.01); *G01R 29/24* (2013.01)

(58) Field of Classification Search
USPC ........................................................ 345/173
See application file for complete search history.

(56) References Cited

U.S. PATENT DOCUMENTS

| 5,844,415 A | 12/1998 | Gershenfeld et al. |
| 2004/0169674 A1* | 9/2004 | Linjama ................ G06F 1/1626 715/702 |

(Continued)

FOREIGN PATENT DOCUMENTS

| EP | 1 770 368 A1 | 4/2007 |
| EP | 2 980 609 A1 | 2/2016 |
| KR | 10-2011-0061750 A | 6/2011 |

OTHER PUBLICATIONS

Amoruso et al., "An improved model of man for ESD applications," *Journal of Electrostatics* 49:225-244, 2000.

(Continued)

*Primary Examiner* — Chineyere D Wills-Burns
(74) *Attorney, Agent, or Firm* — Seed Intellectual Property Law Group LLP

(57) ABSTRACT

A system for detection of a touch gesture of a user on a detection surface includes a processing unit, an electrostatic-charge-variation sensor, which generates a charge-variation signal; and an accelerometer, which generates an acceleration signal. The processing unit is configured to: detect, in the charge-variation signal, a first feature identifying the touch; detect, in the acceleration signal, a second feature identifying the touch; detect a temporal correspondence between the first and second features identifying the touch gesture; and validate the touch gesture only in the case where both the first and second features have been detected and the temporal correspondence satisfies a pre-set relation.

20 Claims, 7 Drawing Sheets

(51) Int. Cl.
  G06F 3/044 (2006.01)
  G06F 3/038 (2013.01)

(56) References Cited

U.S. PATENT DOCUMENTS

| | | | |
|---|---|---|---|
| 2010/0177057 A1* | 7/2010 | Flint | G06F 3/04142 345/174 |
| 2011/0159864 A1* | 6/2011 | Park | H04W 52/0254 455/418 |
| 2013/0085700 A1 | 4/2013 | Modi et al. | |
| 2013/0085711 A1* | 4/2013 | Modi | G01C 22/006 702/141 |
| 2013/0187704 A1* | 7/2013 | Edwards | G06F 3/0445 327/517 |
| 2013/0214998 A1* | 8/2013 | Andes | G09G 5/10 345/8 |
| 2013/0257777 A1* | 10/2013 | Benko | G06F 3/0383 345/173 |
| 2014/0180595 A1* | 6/2014 | Brumback | G16H 40/67 702/19 |
| 2014/0232516 A1 | 8/2014 | Stivoric et al. | |
| 2015/0160780 A1 | 6/2015 | Park | |
| 2016/0283783 A1* | 9/2016 | Yang | G06V 10/751 |
| 2016/0342781 A1 | 11/2016 | Jeon | |
| 2017/0147125 A1* | 5/2017 | Yang | G06F 3/0346 |
| 2019/0079593 A1* | 3/2019 | Ofir | A61B 5/11 |
| 2019/0108686 A1* | 4/2019 | Spivack | G06Q 30/0277 |

OTHER PUBLICATIONS

Ficker, "Electrification of human body by walking," *Journal of Electrostatics* 64:10-16, 2006.

Kurita, "Development of Non-Contact Measurement System of Human Stepping," SICE Annual Conference 2008, Aug. 20-22, 2008, The University Electro-Communications, Japan, 4 pages.

\* cited by examiner

SYSTEM AND METHOD FOR TOUCH-GESTURE RECOGNITION

BACKGROUND

Technical Field

The present disclosure relates to a system and a method for detecting or recognizing a touch gesture of a user on a surface. In particular, the present disclosure envisages a double validation by a sensor for detecting electrostatic-charge variation and by an accelerometer before validating execution of the touch gesture by the user.

Description of the Related Art

At present, one of the most important causes of malfunctioning of mobile devices, in particular mobile phones, regards mechanical pushbuttons, which are subject to failure due to structural weakness, use of brittle flexible PCBs, problems of water resistance, etc.

Alternatives to mechanical pushbuttons envisage pushbuttons based upon capacitive sensors, particularly suited to implementation on full-screen devices. However, they are not always reliable since they are subject to disturbance deriving from the presence of ambient electrical charge.

MEMS accelerometers are used for implementing electronic buttons in so far as they are suited to detecting movements derivative from touching or tapping (or double tapping) by the user, exploiting appropriate algorithms that detect and process the acceleration data supplied by such MEMS accelerometers. Also this solution, however, is subject to environmental conditions or conditions of use that may cause false detection of touches (for example, on account of accelerations deriving from movements of the body of the user that resemble a touch, even if there is in fact no touch).

Furthermore, both solutions of a capacitive and accelerometric type envisage the use of algorithms that need to remain active in a constant way (constantly waiting for detection of the touch), thus generating problems of battery consumption, which are particularly felt in mobile devices.

Electrical-field sensors are used as an alternative or in addition to accelerometric sensors for determination of the activity of a user, or as an aid to interpreting the signals generated by other sensor devices.

The electrical charge is a fundamental component of nature. The electrical charge of an electrostatically charged body can easily be transferred to another body, in conditions of direct contact between the elements or else remotely. When the charge is transferred between two electrically insulated objects, a static charge is generated so that the object with an excess of electrons is negatively charged and the object with a deficit of electrons is positively charged. Shifting of the charges is of a different nature, according to whether the object is a conductive object or a dielectric object. In a conductor, the electrons are distributed throughout the material and are free to move, according to the effect of external electrical fields. In a dielectric there are no electrons free to move, but electric dipoles, with random directions in space (hence with a zero resulting net charge), which, however, can be facing or deformed by means of an external electrical field, thus generating an orderly distribution of charges and hence a polarization. The charge may, in any case, be mobile, according to the properties of the material and other environmental factors.

Devices are known that detect the variation of the electrical field generated by a human when he is moving, or that exploit a detection of a capacitive type. Technologies that use this latter type of detection include, for example, touchscreens, systems for detecting the position of the occupants of a motor vehicle, and devices for determining the position, facing, and mass of an object, as, for example, described in the patent document U.S. Pat. No. 5,844,415, which regards an electrical-field-detection device for determining the position, the distribution of mass, and the facing of an object within a defined space, by arranging a plurality of electrodes within the space defined. This technical solution could moreover be used for recognizing the gestures of a user and the position and facing of the user's hand, for example for interactive use with a processing system, instead of a mouse or joystick.

However, these systems cannot be used for implementing electronic keys or buttons that will guarantee high reliability.

There is consequently felt the need to overcome the drawbacks of the prior art by providing a system and a method for detection of a touch gesture on a surface that will be inexpensive but reliable and that will entail a low computational load.

BRIEF SUMMARY

According to the present disclosure, a system and a method for detection of a touch gesture are provided, as defined in the annexed claims.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein.

DETAILED DESCRIPTION

Figure 1:
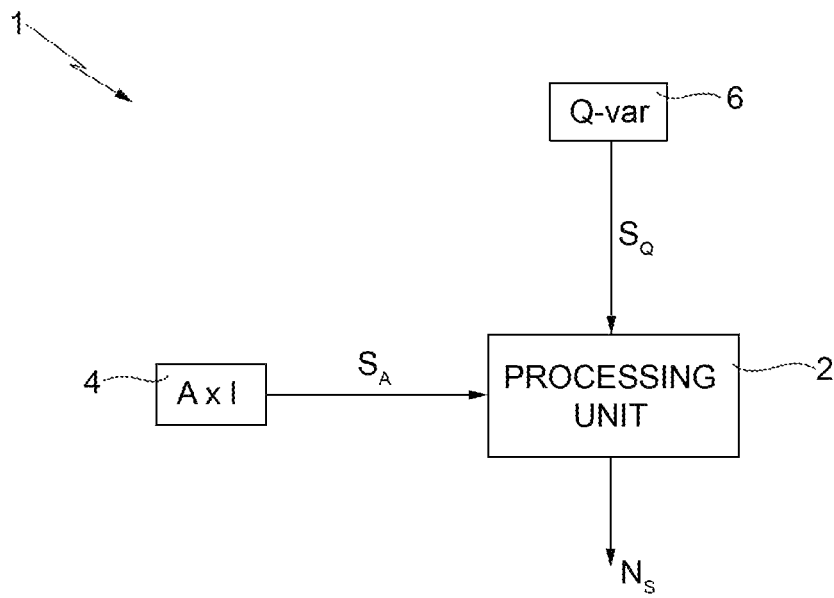
FIG. 1 is a schematic illustration of a touch-gesture detection system including an accelerometer and a sensor for detecting variation of electrical charge, according to an embodiment of the present disclosure.

FIG. 1 is a schematic illustration of an electronic button (e-button) 1 according to one aspect of the present disclosure. The e-button 1 comprises a processing unit 2, an accelerometer 4 coupled to the processing unit 2, and an electrostatic-charge-variation sensor 6 coupled to the processing unit 2.

The accelerometer 4 is configured for detecting at least one component of acceleration along an axis of acceleration orthogonal to a detection surface. The detection surface is a surface on which a user impresses a vibration by touching said surface, for example, with his own finger.

It is to be noted that the e-button 1 (and hence the accelerometer 4) may be installed with any facing with respect to the Earth's gravitational axis, and consequently the accelerometer 4 may be facing so as to not have the vertical axis of detection (axis Z) necessarily in the direction of the force of gravity. For this reason, the axis of detection of the force impressed by the touch is chosen orthogonal to the sensor itself or in the presumed direction of the touch (according to the modes with which the e-button 1 is installed or is required or expected to operate); this likewise enables filtering of possible undesired pulses, which would come from other directions.

As an alternative to the foregoing, it is likewise possible, in a further embodiment, to consider an appropriate vector composition of the three axes of detection of the accelerometer 4 so as to maximize the signal in the direction of the force impressed.

The processing unit 2 receives an acceleration signal $S_A$ from the accelerometer 4 and a charge-variation signal $S_Q$ from the electrostatic-charge-variation sensor 6 and generates, as a function of the acceleration signal $S_A$ and of the charge-variation signal $S_Q$, a signal that indicates detection of a touch by a user.

The accelerometer 4 is, preferably, a triaxial accelerometer, i.e., one designed to detect the acceleration in three mutually orthogonal directions X, Y, Z. The accelerometer 4 is, for example, an integrated sensor of semiconductor material, obtained with MEMS technology, of a type in itself known and for this reason not described in detail. In use, according to an embodiment, the accelerometer 4 detects, as mentioned previously, the component of acceleration generated during touching, and produces a corresponding acceleration signal $S_A$. It is, however, evident that, in general, the present disclosure may also use the information of acceleration on the other axes of detection of the accelerometer (axis X and/or axis Y).

The processing unit 2 may include any circuitry configured to perform the various operations as described herein. In some embodiments, the processing unit 2 is, for example, a microcontroller or an MLC (Machine-Learning Core) residing in the ASIC (Application-Specific Integrated Circuit) integrated in the MEMS.

The e-button 1 is formed, for example, in an integrated way in a printed circuit, or else in an integrated way within a MEMS device or system that houses it. In fact, it is possible to envisage a device or system that integrates a number of sensors (combo), and consequently, in addition to the three axes X, Y, Z of the accelerometer 4, there may also exist dedicated channels for other kinds of detection (for example, a gyroscope, a temperature sensor, etc.), including the electrostatic-charge-variation sensor.

Figure 2:
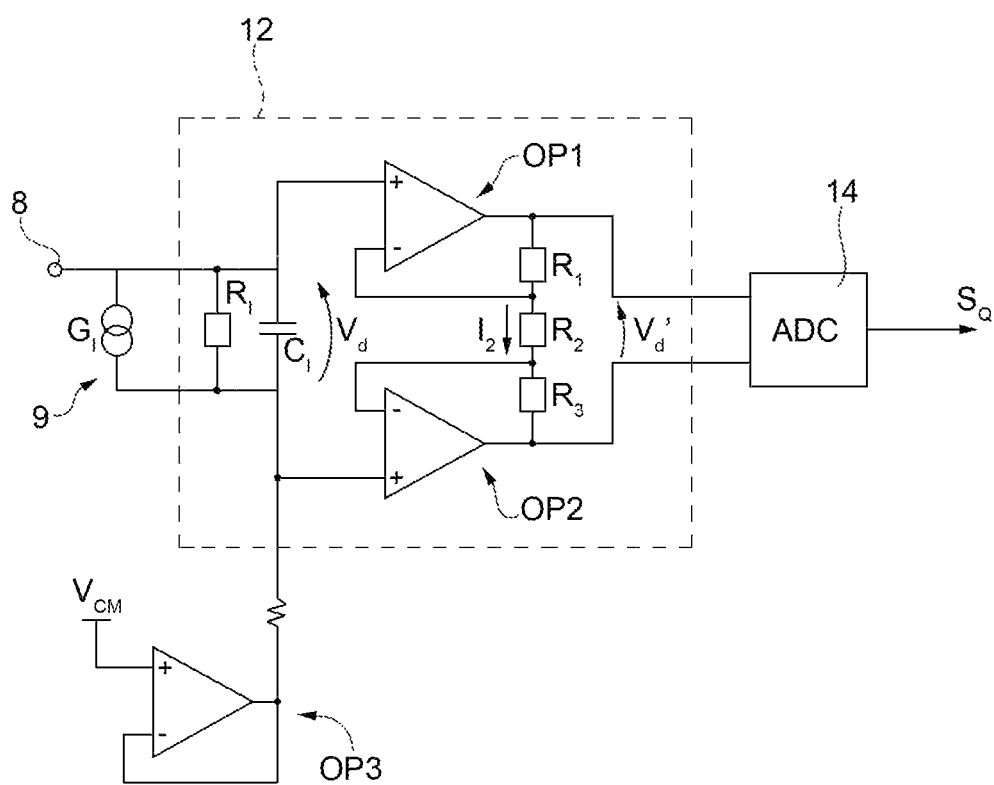
FIG. 2 illustrates an embodiment of the electrical-charge-variation sensor.

FIG. 2 illustrates an embodiment provided by way of non-limiting example of an electrostatic-charge-variation sensor 6. The electrostatic-charge-variation sensor 6 comprises an input electrode 8, which can be coupled to a portion of the body of a user. In particular, the electrostatic-charge-variation sensor 6 of FIG. 2 is configured for being set in direct contact with a portion of the body of a user for detecting touch. Typically, the user uses his finger, and in particular the fingertip, to make the touch.

The input electrode 8 forms part of a differential input 9 of an instrumentation amplifier 12.

Present across the differential input 9 are an input capacitor $C_I$, biased by means of a DC current source $G_I$ and an input resistor $R_I$, which are connected in parallel together and to the input capacitor $C_I$. In use, the voltage Vd across the input capacitor $C_I$ remains constant until the user touches the electrode 8. In this case, the voltage across the input capacitor $C_I$ varies on account of the process of electrical charging/discharging through the body of the user. After a transient (the duration of which is defined by the RC constant of the parallel of the capacitor $C_I$ and the resistor $R_I$), the voltage Vd returns to its steady-state value.

The instrumentation amplifier 12 is basically constituted by two operational amplifiers OP1 and OP2. A biasing stage (buffer) OP3 is used for biasing the instrumentation amplifier 12 to a common-mode voltage $V_{CM}$.

The inverting terminals of the operational amplifiers OP1 and OP2 are connected together by means of a resistor $R_2$. Since the two inputs of each operational amplifier OP1, OP2 must be at the same potential, the input voltage Vd is also applied across $R_2$ and causes, through said resistor $R_2$, a current equal to $I_2=Vd/R_2$. This current $I_2$ does not come from the input terminals of the operational amplifiers OP1, OP2, and for this reason traverses the two resistors $R_1$, which are connected, between the outputs of the operational amplifiers OP1, OP2, in series to the resistor $R_2$; thus, the current $I_2$, by traversing the series of the three resistors $R_1$-$R_2$-$R_1$, produces an output voltage Vd' given by Vd'=$I_2$·$(2R_1+R_2)$=Vd·$(1+2R_1/R_2)$. Consequently, the overall gain of the circuit of FIG. 2 is Ad=$(1+2R_1/R_2)$. The differential gain depends upon the value of the resistor $R_2$ and can hence be modified by acting on the resistor $R_2$.

The components of the amplifier 12 are chosen in such a way that the amplifier 12 will present a high impedance (of the order of $10^9 \Omega$) in its passband (chosen between DC and 500 Hz).

The voltage Vd across the input capacitor $C_I$ is detected by the amplifier 12.

The differential output Vd' is hence proportional to the potential Vd at input, and is supplied at input to an analog-to-digital converter 14, which supplies at output the charge-variation signal $S_Q$ for the processing unit 2. The charge-variation signal $S_Q$ is, for example, a high-resolution digital flow (16 bits or 24 bits).

According to one embodiment, the analog-to-digital converter 14 is optional in so far as the processing unit 2 may be configured for working directly on the analog signal, or may itself comprise an analog-to-digital converter designed to convert the signal Vd'.

According to a different embodiment, with an analog-to-digital converter (ADC) having appropriate characteristics (e.g., differential input, high input impedance, high resolution, dynamic range optimized for the quantities to be measured, low noise), the amplifier stage 12 can be omitted, and the signal can be supplied directly to the input of the analog-to-digital converter.

Figure 3:
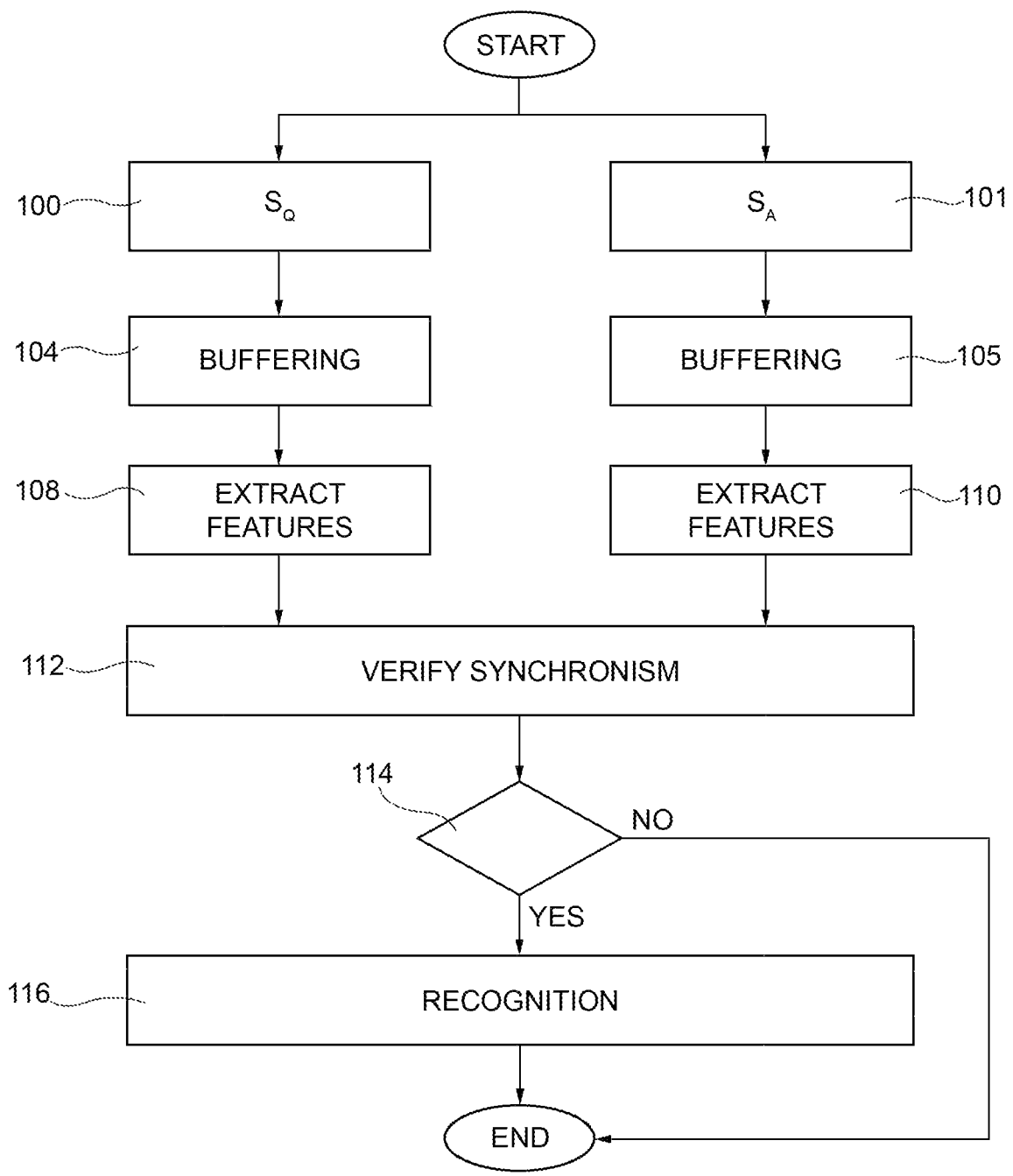
FIG. 3 illustrates, by means of a block diagram, a method implemented by the touch-gesture detection system of FIG. 1 according to one embodiment of the present disclosure.

FIG. 3 illustrates, by means of a flowchart, the operations executed by the processing unit 2.

With reference to steps 100 and 101, the processing unit receives, from the electrostatic-charge-variation sensor 6 and from the accelerometer 4, the charge-variation signal $S_Q$ and the acceleration signal $S_A$, respectively. Steps 100 and 101 are executed in parallel (simultaneously). The signals $S_Q$ and $S_A$ are, in the embodiment described, digital signals.

Then, steps 104 and 105, the processing unit 2 executes respective buffering operations on the signals $S_Q$ and $S_A$ received (saving of the data to a local memory). Optionally, there may be envisaged, before the buffering steps, respective filtering operations (for example, using lowpass or highpass filters). In particular, the filtering has the function of cleaning up the signals $S_Q$ and $S_A$ from noise or from components of disturbance at non-significant frequencies (e.g., around 50 Hz or 60 Hz for $S_Q$), or from components at extremely low frequency (e.g., component of the acceleration of gravity for $S_A$). For instance, the signal $S_Q$ can be filtered for eliminating components of above 20 Hz. The signal $S_A$ can be filtered by means of a bandpass filter with passband from 0.1 Hz to 100 Hz.

Next (step 108), extraction is performed of the components of the charge-variation signal $S_Q$ that identify touch by the user.

Likewise (step 110), extraction is performed of the components of the acceleration signal $S_A$ that identify touch by the user.

The operations of steps 108 and 110 may be executed simultaneously, or in respective non-overlapping, or only partially overlapping, time intervals.

In an embodiment, step 108 is executed applying a threshold comparison on the charge-variation signal $S_Q$. In particular, overstepping of a threshold $Th_Q$ by the charge-variation signal $S_Q$ is associated to execution of a touch by the user. The threshold $Th_Q$ is, in one embodiment, a threshold of a fixed and pre-set type. In a further embodiment, the threshold $Th_Q$ is of an adaptive type; i.e., it varies as a function of the evolution of the charge-variation signal $S_Q$. Calculation of the threshold $Th_Q$ of an adaptive type may be executed by exploiting techniques known in the prior art. For instance, it is possible to use sliding windows or overlapping windows. Other techniques for real-time calculation of adaptive threshold may be used.

In an embodiment provided by way of example, the threshold $Th_Q$ is chosen as the mean of the signal $S_Q$ (in the window considered) plus a multiple of the standard deviation of the signal $S_Q$ (in the window considered): $Th_Q$=mean $(S_Q)$+n·stddev$(S_Q)$, where n is chosen in the range between 2 and 6, for example 4 (where mean is the function of arithmetical mean and stddev is the standard-deviation function).

The time window is chosen of an appropriate value. This value depends upon the type of application. The present applicant has found that values compatible with processing carried out on a microcontroller (i.e., taking into consideration the buffers, the memory used, and the computational resources) range from 2 to 10 s.

In an embodiment, in order to save computational resources, the signal $S_A$ of the accelerometer 4 is not processed (step 110) until step 108 yields a positive result (detection of a possible touch). In this case, overstepping of the threshold $Th_Q$ by the charge-variation signal $S_Q$ hence generates a corresponding trigger signal for processing of the acceleration signal $S_A$.

With reference to step 110, the acceleration signal $S_A$ is processed for confirming the presence of the touch identified in step 108. Processing of the acceleration signal $S_A$ may envisage, as described with reference to the charge-variation signal $S_Q$, a comparison with a fixed or adaptive threshold $Th_A$ (for example, a moving-average threshold), as described in the patent application US2013/0085711 or in the patent EP1770368. For instance, the moving-average threshold adjusts the comparison threshold on the basis of the mean value of the acceleration detected.

Moreover, as an alternative to the previous embodiments, it is likewise possible to carry out a frequency analysis, e.g., by means of Fast Fourier Transform (FFT), and apply a threshold for detecting the frequency components of the signal $S_A$ that overstep said threshold. These components hence identify execution of a touch. An example is illustrated in the patent application US2013/0085700. Frequency analysis may be performed on the data of the accelerometer to determine, optionally, a dominant frequency that can be used for selecting a bandpass filter. For instance, if the dominant frequency is found to be 2 Hz, it is possible to select a bandpass filter of 1.5-2.5 Hz for filtering the signal. Filtering makes it possible to smooth the data for a better analysis and detection of the touch.

The operations of steps 108 and 110 likewise have the function of identifying, in the charge-variation signal $S_Q$ and in the acceleration signal $S_A$, the instant when the physical touch has been made by the user. In order to supply at output a confirmation of touch, in fact, the present disclosure utilizes both of the signals to identify that touch has occurred at the same instant. Since, as has been said, both of the signals $S_Q$ and $S_A$ are stored in a buffer (steps 104, 105) for a certain time interval, associated to each sample or set of samples is also the acquisition time interval. The presence of simultaneous overstepping of threshold (steps 108, 110) by both of the signals $S_Q$ and $S_A$ in said common time interval is consequently indicative of the presence of a touch. A certain delay between the two detections is in any case acceptable, and falls within the normal delay of generation, acquisition, and processing of the two signals (operations executed by means of procedures that are different from one another).

The step described of detection of synchronism of the touch is made (FIG. 3) in step 112. If the check yields a negative result, i.e., if the two signals $S_Q$ and $S_A$ do not both identify the touch (e.g., one of the checks referred to in steps 108, 110 is below threshold), then (output N from the decision step 114), the processing unit 2 determines the absence of touch by the user. Otherwise (output Y from the decision step 114), the processing unit 2 determines the presence of the touch by the user.

In step 112, verification of "resemblance" of the shapes of the signals is also made. The amplitude (axis of the ordinates) of the cross correlation is indicative of the degree of resemblance of the signals, while the shift with respect to zero (axis of the abscissae) is indicative of the delay between the two signals. See, for greater detail, the sequel of the description, where the operation of cross correlation is discussed in detail.

FIG. 3 illustrates a further optional step 116 that is carried out in the case of output Y from the decision step 114. Step 116 guarantees greater robustness of the decision of confirmation of touch. Step 116 envisages an analysis of recognition of the shape of the signals $S_Q$ and $S_A$ in order to verify that said signals effectively correspond to the ones expected from the touch by a human operator or by means of a predefined touch device (e.g., an electronic pen).

For instance, it is possible to use machine-learning and/or artificial-intelligence techniques (in themselves known and available in the prior art) for automatic recognition of specific patterns of the signal $S_Q$ associated to a predefined (expected) touch executed by the user so as to discriminate between different types of touch by means of electronic devices or by means of the user's finger.

In order to improve detection of the signals $S_Q$ and $S_A$, which, as is known, may have an evolution characterized by rapid variations over a very narrow interval (as shown, by way of example, in FIG. 4A), it is possible, in an embodiment of the present disclosure, to execute an operation of extraction of the envelope of both of the signals $S_Q$ and $S_A$ (as shown by way of example in FIG. 4B, which refers to extraction of the envelope of the signal of FIG. 4A), following upon step 104 and step 105, respectively.

The processing operations described hereinafter implement, in this embodiment, steps 108 and 110 and are executed as an alternative to what has been described previously in relation to said steps 108, 110.

Figure 5:
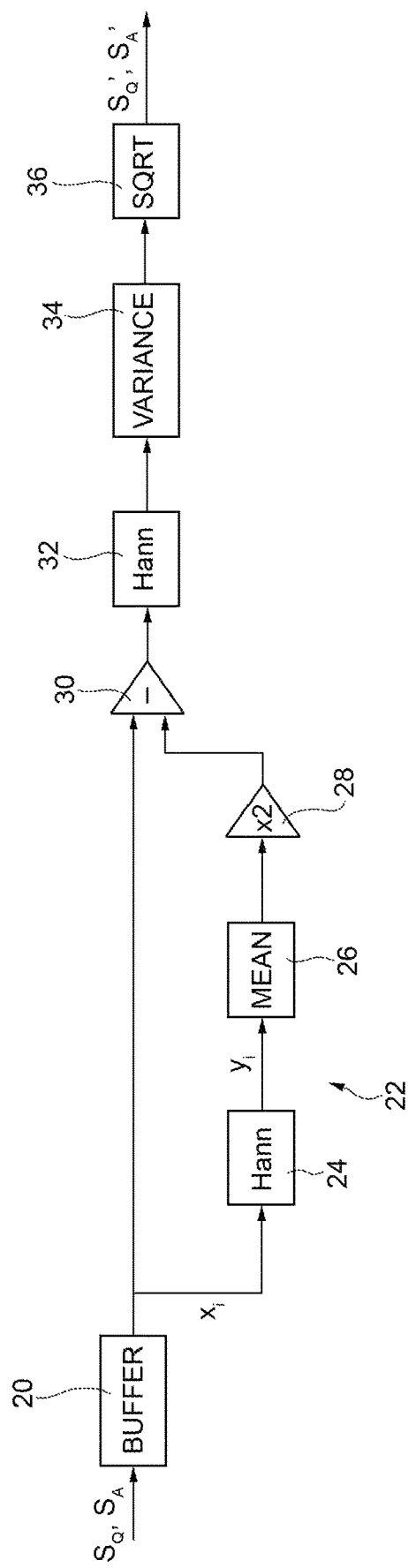
FIG. 5 illustrates, by means of functional blocks, operations for extraction of the envelope of a charge-variation signal of an acceleration signal.

The operations for extraction of the envelope of the charge-variation signal $S_Q$ and of the acceleration signal $S_A$ are represented schematically in FIG. 5. FIG. 5 applies indifferently to the charge-variation signal $S_Q$ and to the acceleration signal $S_A$. The operations illustrated and described are executed both for the charge-variation signal $S_Q$ and for the acceleration signal $S_A$.

With reference to FIG. 5, the digital samples are acquired and stored in the buffer 20 (steps 100, 101). The buffer 20 is, in particular, designed to store a number K of samples (e.g., K=25). The value of K may in any case vary as desired, considering that the higher the value of K, the smoother the signal generated at output from the chain of blocks of FIG. 5. For instance, K is chosen in the range 10-30.

The samples stored in the buffer 20 are sent to a first input of a subtraction block 30. The other input of the subtraction block 30 receives samples further processed (filtered) through the branch 22, as described hereinafter.

The branch 22 comprises in the first place a processing block that uses a Hann window 24, or Hann function, which is of a type in itself known and implements the following function:

$$y_i = \frac{1}{2}x_i\left(1 - \cos\frac{2\pi i}{K}\right)$$

where $x_i=[x_0, \ldots, x_{K-1}]$ are the samples at input to the processing block 24 (the subscript "i=0, ..., K−1" identifies the i-th sample) and $y_i=[y_0, \ldots, y_{K-1}]$ are the samples at output from the processing block 24.

The branch 22 further comprises a mean-calculation block 26, which receives the samples $y_i=[y_0, \ldots, y_{K-1}]$ and executes an operation of arithmetical mean of the value of said samples.

The branch 22 further comprises a multiplication block 28, which receives at input the mean value generated at output from block 26 and executes an operation of multiplication by 2 of said mean value (since the Hann window of block 24 halves the mean amplitude of the signal, the attenuation introduced is compensated with this operation), generating an output that is supplied to the second input of the subtraction block 30.

At output from the subtraction block 30, the signal at input to the subtraction block 30 minus its own mean value is obtained, hence a signal that on average oscillates around zero, without any offset. The output of the subtraction block 30 is then further processed by means of a block 32 that implements a further Hann window, as has been described for block 24. This further Hann window has the function of smoothing the signal, rounding off the peaks and discontinuities at the ends of the analysis window.

Block 34 receives at input the array generated at output from block 32, and carries out an estimation of the variance of said array, in a way in itself known. The output from block 34 is consequently a scalar.

Finally, an operation of square root (block 36) of the value of the variance has the function of compressing the dynamic range of the output signal, as well as bringing it back to the initial physical dimensions. In other words, the variance raises to the power of two, and the square root restores the physical dimensions. For instance, for the signal $S_A$, its physical dimension at input is expressed in m/s$^2$; after calculation of the variance, it is expressed in (m/s$^2$)$^2$; after extraction of the square root, it returns to m/s$^2$.

Figure 4B:
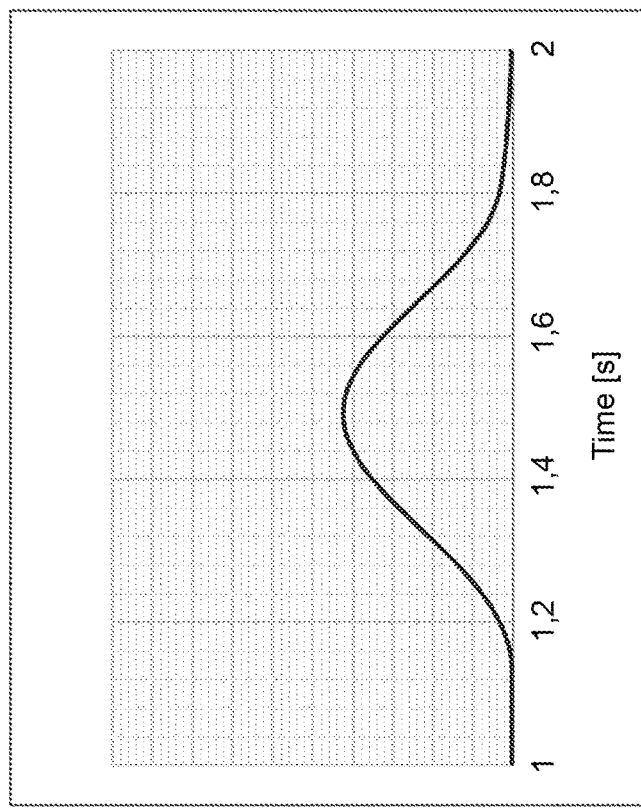
FIGS. 4A and 4B are graphic illustrations of processing of a signal performed by the touch-gesture detection system of FIG. 1, during intermediate operations of the present disclosure.

The signal of FIG. 4B is thus obtained.

Figure 4A:
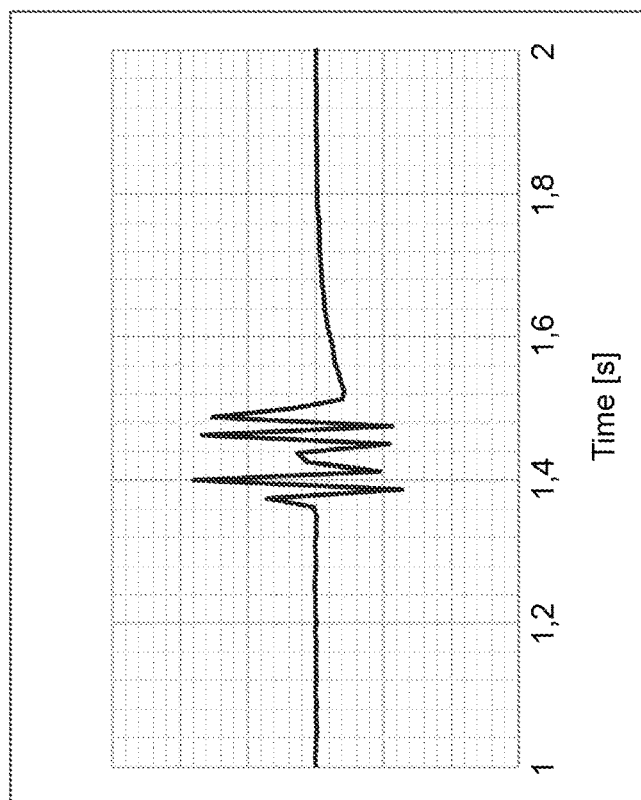

In particular, with reference to the present description, smoothed signals of charge variation $S_Q'$ and acceleration $S_A'$ are obtained (passage from the plot of FIG. 4A to the plot of FIG. 4B).

The operation of extraction of the envelope of the acceleration signal $S_A$ may be preceded by an operation of selection of the axis of detection of the accelerometer to be used for generation of the acceleration signal $S_A$. For instance, it is possible to isolate just the component regarding the axis of detection orthogonal to the surface on which the touch by the user physically occurs, or else it is possible to use a signal that combines two or more axes of detection (also according to of the type of accelerometer used: uniaxial, biaxial, or triaxial). By way of non-limiting example, it is possible to use a combination of the three axes of detection X, Y, and Z by applying an operation of calculation of the modulus (square root, sqrt, of the sum of the squares of the components) in such a way that $S_A=\text{sqrt}(X^2+Y^2+Z^2)$.

Then, a step is carried out of evaluation of the amplitude of the peak of the smoothed signals $S_Q'$ and $S_A'$ and of temporal correspondence between the signals.

To carry out these steps, it is expedient for the smoothed signals $S_Q'$ and $S_A'$ to be normalized so that they can be effectively compared with one another. Consequently, an operation of normalization of the amplitude, of a type in itself known, in the range [0-1], is carried out.

The aforementioned operations of evaluation of the amplitude and temporal correspondence may be executed by implementing a cross-correlation operation. In particular, given two sequences (arrays) Q=[q$_0$, ..., q$_{N-1}$] and A=[a$_0$, ..., a$_{N-1}$] of digital samples corresponding to the smoothed signals of charge variation $S_Q'$ and acceleration $S_A'$, respectively, the cross-correlation function R$_{Q,A}$ that can be applied is the following (in discrete form):

$$R_{Q,A}[j] = \sum_{i=0}^{N-1} x_i \cdot y_{i+j}$$

where N is the number of samples of the digitized signals $S_Q'$ and $S_A'$, for example N=200; j=−(N−1), ..., 0, ..., (N−1); $x_j$=0 when j<0 or j=N; and $y_j$=0 when j<0 or j=N.

Figure 5A:
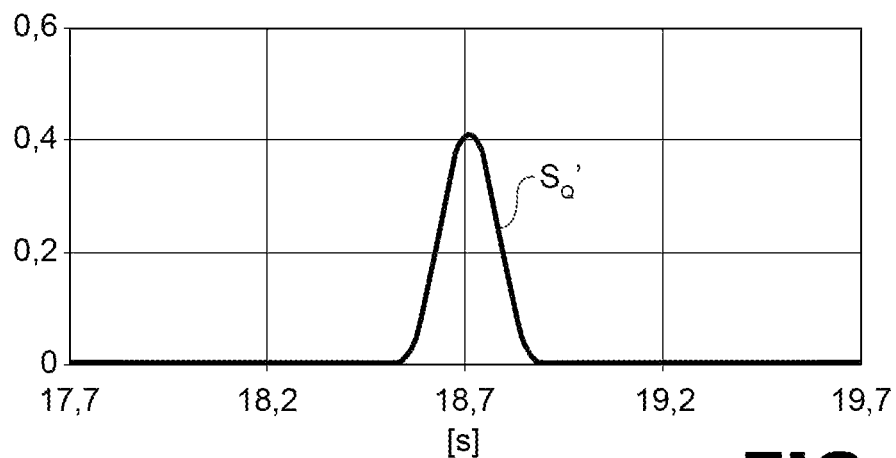
FIGS. 5A-5C are graphic illustrations of signals that lead to a validation of detection of the touch gesture, during intermediate operations of the present disclosure.
Figure 5B:
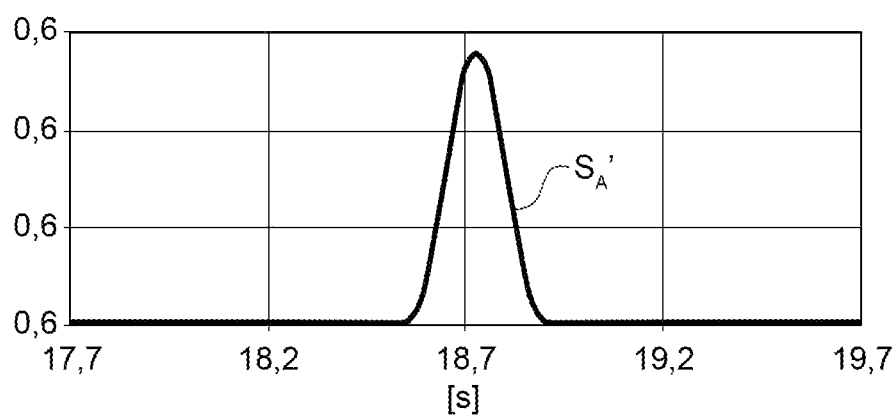
Figure 5C:
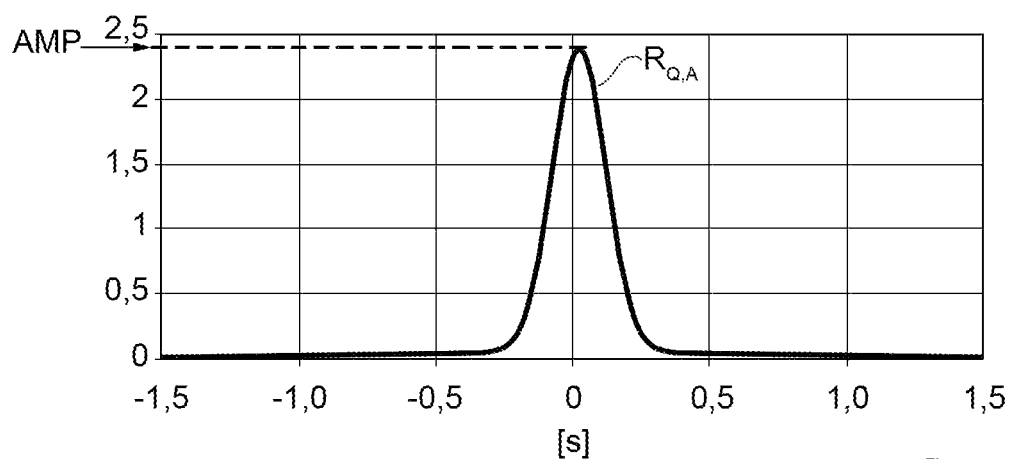

The cross-correlation operation is represented schematically in graphic form in FIGS. 5A-5C, which show, respectively: the smoothed charge-variation signal $S_Q'$ (FIG. 5A); the smoothed acceleration signal $S_A'$ (FIG. 5B); and the cross-correlation signal R$_{Q,A}$ (FIG. 5C). As may be noted, in this example illustrated, the signals $S_Q'$ and $S_A'$ are simultaneous (or approximately such), and the cross-correlation function supplies as output a signal having a significant amplitude AMP (value on the axis of the ordinates) and an approximately zero value of temporal correspondence (time lag) (value on the axis of the abscissae).

Step 112 of FIG. 3 includes, in this case, a threshold evaluation applied both to the amplitude AMP and to the time lag of the signal R$_{Q,A}$. If the amplitude AMP is higher than an amplitude threshold (which means presence of resemblance between the signals) and the time lag is shorter than a threshold time (which means presence of synchronism), then (output Y from the decision step 114) occurrence of touch of the e-button 1 by the user is determined. Instead, if at least one of the two threshold comparisons yields a negative result (output N from the decision step 114) it is determined that no touch has occurred.

Figure 6A:
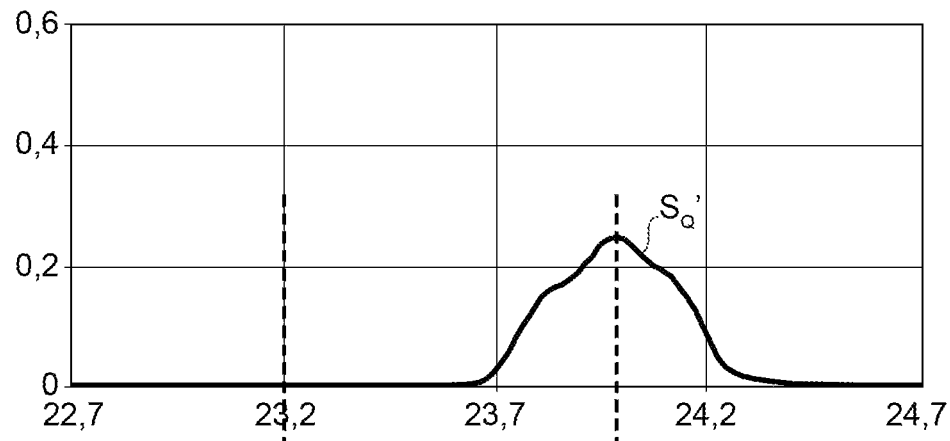
FIGS. 6A-6C are graphic illustrations of signals that lead to a negation of detection of the touch gesture, during intermediate operations of the present disclosure.
Figure 6B:
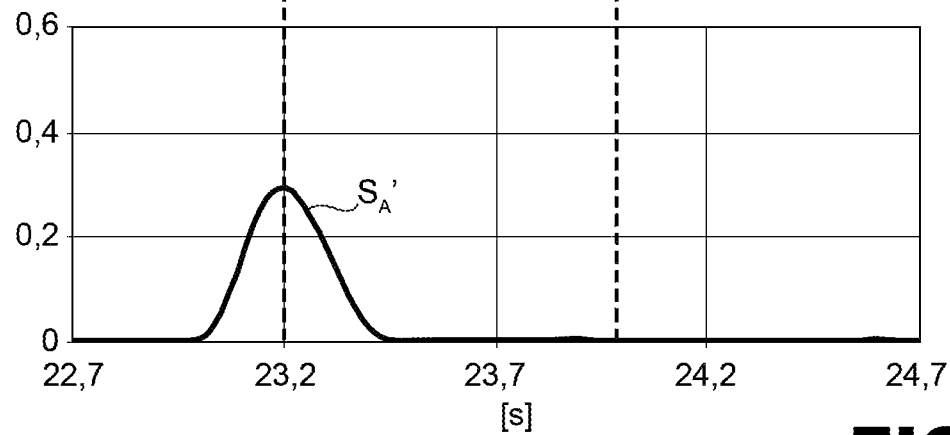
Figure 6C:
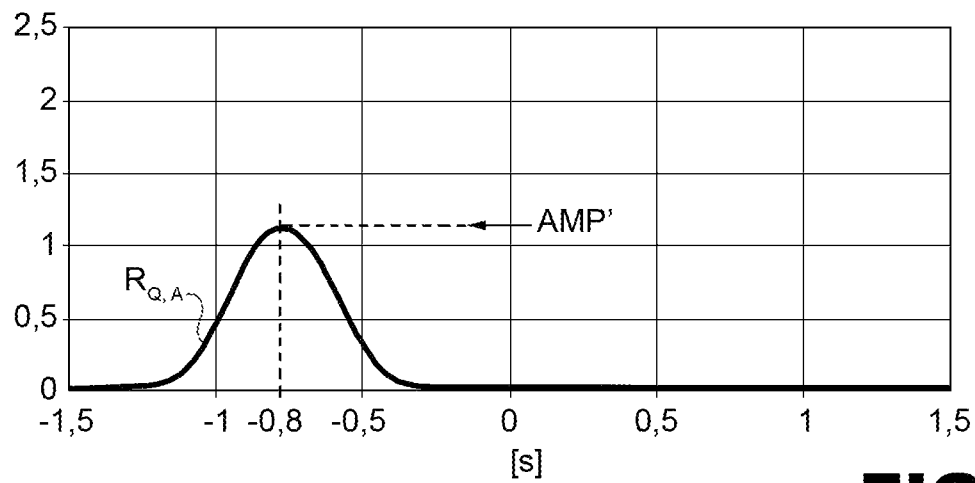

By way of example, FIGS. 6A-6C are graphic representations of a case where the signals $S_Q'$ and $S_A'$ are not simultaneous, but are acquired with a time interval in between.

FIGS. 6A-6C illustrate: the smoothed charge-variation signal $S_Q'$ (FIG. 6A); the smoothed acceleration signal $S_A'$ (FIG. 6B); and the cross-correlation signal $R_{QA}$ (FIG. 6C). As may be noted, in this example illustrated, the signals $S_Q'$ and $S_A'$ are temporally staggered (distance $t_S$), and the cross-correlation function supplies at output a signal having a smaller amplitude AMP' as compared to the case of FIG. 5C (value on the axis of the ordinates) and a value of time lag of approximately 0.8 sec (value on the axis of the abscissae). The shapes of the two smoothed signals $S_Q'$ and $S_A'$ resemble one another less than do those of the previous case: for this reason, the amplitude AMP' is smaller.

Step 112 of FIG. 3 also in this case includes a threshold evaluation carried out both on the amplitude AMP' and on the time lag of the signal $R_{QA}$. In this example, it is assumed that at least one between the amplitude AMP' and the time lag does not satisfy the pre-set relation with the respective threshold and, therefore, the decision step 114 will yield a negative result (output N). The touch is not validated.

By way of example, the thresholds envisaged for recognition of the touch are: amplitude threshold in the range from 0 s to 0.3 s; lag-time threshold in the range from 0 s to ±0.2 s (the time lag may be positive or negative, according to which signal is in advance with respect to the other).

Figure 7:
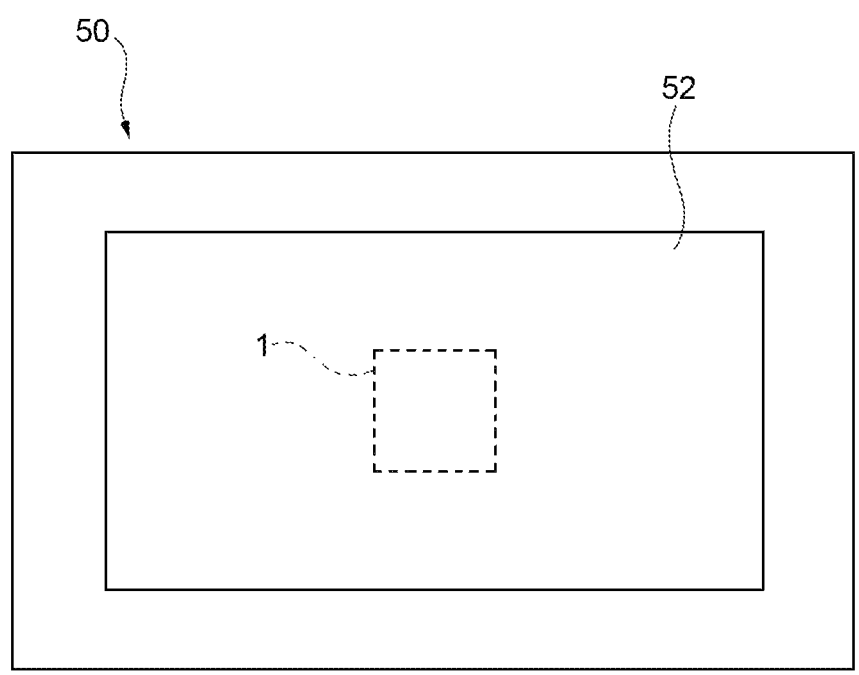
FIG. 7 illustrates an electronic system that includes the detection system of FIG. 1.

FIG. 7 is a schematic illustration of an electronic system 50 that includes the e-button 1 described previously, according to any of the embodiments of the present disclosure.

For instance, the electronic system 50 comprises a touch surface 52 (detection surface), which is the surface on which the user performs the physical gesture of touching. This surface is made, for example, of plastic material, with a thickness of approximately 1 mm. Positioned underneath the surface 52 is the e-button 1, for example housed in a package of its own.

In order to optimize generation of both of the signals $S_Q$ and $S_A$, it is preferable for the corresponding arrangement between the surface 52 and the electronic button 1 to satisfy certain requisites:

the sensors for detection of acceleration and charge variation should be as close as possible to the area identified as touch surface (e-button); and/or the sensors should be positioned close to one another to optimize auto-correlation of the respective signals (minimization of time lag and maximization of amplitude).

The disclosure may be effectively implemented in all those devices in which a mechanical contact cannot be present, either for requisites of water-resistance and immunity to dust or for requisites of mechanical strength. Some examples are smartphones, smartwatches, electrical household appliances, industrial equipment, etc. The advantages achieved by the present disclosure emerge clearly from the foregoing description.

Variations and modifications may be made to the present disclosure, without thereby departing from the scope identified by the ensuing claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system for detecting a touch gesture of a user on a detection surface, comprising:
    a processing unit;
    an electrostatic-charge-variation sensor, operatively coupled to the processing unit and to the detection surface, configured to detect a variation of electrostatic charge on the detection surface and to generate a charge-variation signal; and
    an accelerometer, operatively coupled to the processing unit and to the detection surface, configured to detect a vibrational signal on the detection surface and to generate an acceleration signal,
    wherein the processing unit is configured to:
        acquire the charge-variation signal;
        acquire the acceleration signal;
        detect, in the charge-variation signal, a first signal feature identifying the touch gesture of the user;
        detect, in the acceleration signal, a second signal feature identifying the touch gesture of the user;
        detect a temporal and shape correspondence between the first and second signal features that identify the touch gesture; and
        validate the touch gesture of the user only in the case where both of the first and second signal features have been detected and the temporal correspondence satisfies a pre-set relation.

2. The system according to claim 1, wherein the first signal feature is an amplitude of the charge-variation signal, and the second signal feature is an amplitude of the acceleration signal.

3. The system according to claim 1, wherein the processing unit is configured to detect a time lag between the first signal feature and the second signal feature.

4. The system according to claim 1, wherein the processing unit is configured to detect the first signal feature by at least one of: detecting a peak of the charge-variation signal exceeding a fixed or adaptive threshold, or detecting specific patterns of the charge-variation signal by machine-learning or artificial-intelligence algorithms,
    and the processing unit is configured to detect the second signal feature by at least one of: detecting a peak of the acceleration signal exceeding a respective fixed or adaptive threshold, or detecting specific patterns of the acceleration signal by machine-learning or artificial-intelligence algorithms.

5. The system according to claim 1, wherein the processing unit is configured to:
    calculate an envelope of the charge-variation signal to generate a smoothed charge-variation signal;
    calculate an envelope of the acceleration signal to generate a smoothed acceleration signal; and
    calculate a cross correlation between the smoothed charge-variation signal and the smoothed acceleration signal.

6. The system according to claim 1, wherein the processing unit is configured to detect the second signal feature only in response to detecting the first signal feature identifying the touch gesture of the user.

7. The system according to claim 1, wherein the electrostatic-charge-variation sensor comprises:
an input electrode configured to contact the user;
an instrumentation amplifier having a differential input coupled to the input electrode, the instrumentation amplifier configured to output a differential voltage; and
an analog-to-digital converter configured to receive the differential voltage and to generate the charge-variation signal based on the received differential voltage.

8. An electronic system, comprising:
a surface for detection of a touch gesture of a user;
a processing unit;
an electrostatic-charge-variation sensor, operatively coupled to the processing unit and to the detection surface, configured to detect a variation of electrostatic charge on the detection surface and to generate a charge-variation signal; and
an accelerometer, operatively coupled to the processing unit and to the detection surface, configured to detect a vibrational signal on the detection surface and to generate an acceleration signal,
wherein the processing unit is configured to:
acquire the charge-variation signal;
acquire the acceleration signal;
detect, in the charge-variation signal, a first signal feature identifying the touch gesture of the user;
detect, in the acceleration signal, a second signal feature identifying the touch gesture of the user;
detect a temporal and shape correspondence between the first and second signal features that identify the touch gesture; and
validate the touch gesture of the user only in the case where both of the first and second signal features have been detected and the temporal correspondence satisfies a pre-set relation.

9. The system according to claim 8, wherein the first signal feature is an amplitude of the charge-variation signal, and the second signal feature is an amplitude of the acceleration signal.

10. The system according to claim 8, wherein the processing unit is configured to detect a time lag between the first signal feature and the second signal feature.

11. The system according to claim 8, wherein the processing unit is configured to detect the first signal feature by at least one of: detecting a peak of the charge-variation signal exceeding a fixed or adaptive threshold, or detecting specific patterns of the charge-variation signal by machine-learning or artificial-intelligence algorithms,
and the processing unit is configured to detect the second signal feature by at least one of: detecting a peak of the acceleration signal exceeding a respective fixed or adaptive threshold, or detecting specific patterns of the acceleration signal by machine-learning or artificial-intelligence algorithms.

12. The system according to claim 8, wherein the processing unit is configured to:
calculate an envelope of the charge-variation signal to generate a smoothed charge-variation signal;
calculate an envelope of the acceleration signal to generate a smoothed acceleration signal; and
calculate a cross correlation between the smoothed charge-variation signal and the smoothed acceleration signal.

13. The system according to claim 8, wherein the processing unit is configured to detect the second signal feature only in response to detecting the first signal feature identifying the touch gesture of the user.

14. The system according to claim 8, wherein the electrostatic-charge-variation sensor comprises:
an input electrode configured to contact the user;
an instrumentation amplifier having a differential input coupled to the input electrode, the instrumentation amplifier configured to output a differential voltage; and
an analog-to-digital converter configured to receive the differential voltage and to generate the charge-variation signal based on the received differential voltage.

15. A method for detecting a touch gesture of a user on a detection surface, comprising:
supplying a charge-variation signal by an electrostatic-charge-variation sensor operatively coupled to a processing unit and to the detection surface, the electrostatic-charge variation sensor configured to detect a variation of electrostatic charge on the detection surface in response to the touch gesture of the user;
supplying an acceleration signal by an accelerometer, operatively coupled to the processing unit and to the detection surface, the accelerometer configured to detect a vibration applied to the detection surface in response to the touch gesture of the user;
detecting, in the charge-variation signal, a first signal feature identifying the touch gesture of the user;
detecting, in the acceleration signal, a second signal feature identifying the touch gesture of the user;
detecting a temporal and shape correspondence between the first and second signal features that identify the touch gesture; and
validating the touch gesture of the user only in the case where both the first and second signal features have been detected and the temporal correspondence satisfies a pre-set relation.

16. The method according to claim 15, wherein the first signal feature is an amplitude of the charge-variation signal, and the second signal feature is an amplitude of the acceleration signal.

17. The method according to claim 15, wherein the detecting the temporal correspondence includes detecting a time lag between the first signal feature and the second signal feature.

18. The method according to claim 15, wherein the detecting the first signal feature includes at least one of: detecting a peak of the charge-variation signal exceeding a fixed or adaptive threshold, or detecting specific patterns of the charge-variation signal by machine-learning or artificial-intelligence algorithms.

19. The method according to claim 15, wherein the detecting the second signal feature includes at least one of: detecting a peak of the acceleration signal exceeding a respective fixed or adaptive threshold, or detecting specific patterns of the acceleration signal by machine-learning or artificial-intelligence algorithms.

20. The method according to claim 15, wherein the detecting the first signal feature, the detecting the second signal feature, and the detecting the temporal and shape correspondence between the first and second signal features include:

calculating an envelope of the charge-variation signal to generate a smoothed charge-variation signal;
calculating an envelope of the acceleration signal to generate a smoothed acceleration signal; and
calculating a cross correlation between the smoothed charge-variation signal and the smoothed acceleration signal.

* * * * *